(12) United States Patent
Kabadi

(10) Patent No.: US 6,269,864 B1
(45) Date of Patent: Aug. 7, 2001

(54) PARALLEL-PLATE/PIN-FIN HYBRID COPPER HEAT SINK FOR COOLING HIGH-POWERED MICROPROCESSORS

(75) Inventor: Ashok N. Kabadi, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/504,019

(22) Filed: Feb. 18, 2000

(51) Int. Cl.[7] ............................................. F28F 7/00
(52) U.S. Cl. .................. 165/80.3; 165/185; 174/16.3; 257/722; 361/697; 361/704
(58) Field of Search .................. 165/80.3, 185, 165/104.33; 361/697, 688, 700, 699, 704; 257/714, 722; 174/16.3

(56) References Cited

U.S. PATENT DOCUMENTS

| 5,077,601 | * | 12/1991 | Hatada et al. | 165/80.3 |
|---|---|---|---|---|
| 5,224,538 | * | 7/1993 | Jacoby | 165/185 |
| 5,912,805 | * | 6/1999 | Freuler et al. | 165/80.3 |
| 5,940,269 | * | 8/1999 | Ko et al. | 165/185 |
| 5,957,194 | * | 9/1999 | Azar | 165/80.3 |
| 6,015,008 | * | 1/2000 | Kogure et al. | 165/185 |
| 6,054,198 | * | 4/2000 | Bunyan et al. | 165/185 |
| 6,119,657 | * | 9/2000 | Clemens | 165/80.3 |

* cited by examiner

Primary Examiner—Marvin M. Lateef
Assistant Examiner—Terrell McKinnon
(74) Attorney, Agent, or Firm—Schwegman, Lundberg, Woessner & Kluth, P.A.

(57) ABSTRACT

A heat sink for a microprocessor includes a thermally conductive base having a plurality of fin structures upwardly extending from the thermally conductive base. The plurality of fin structures having a first surface comprising a plurality of surface area enhancer structures to increase a convection surface area of the heat sink for a given volume of a heat sink to enhance heat dissipation from the heat sink.

28 Claims, 5 Drawing Sheets

PARALLEL-PLATE/PIN-FIN HYBRID COPPER HEAT SINK FOR COOLING HIGH-POWERED MICROPROCESSORS

TECHNICAL FIELD

This invention relates generally to a heat dissipation device for an integrated circuit assembly, and more particularly to the structure of a heat sink.

BACKGROUND

Microprocessors and other related computer components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

In current packaging techniques, heat sinks are often applied to the front side of microprocessors having a die to dissipate heat from the microprocessors. The overall size of the heat sinks is limited by the volume constraints of the housing. To improve the amount of heat dissipated from the heat producing components, there is a need to increase convention surface area of the heat sinks without increasing the volume of the heat sinks. The current techniques require the reduction of spacing between fins of the heat sink to increase surface area of the heat sink. However, this results in tighter spacing between fins, which in turn increases air flow resistance resulting in higher thermal resistance.

For the reasons stated above, and for other reasons stated below which will become apparent to those skilled in the art upon reading and understanding the present specification, there is a need to increase convection surface area of a heat sink without having to reduce the spacing between fins for a given volume of heat sink for enhanced heat dissipation by the heat sink.

BRIEF DESCRIPTION OF THE DRAWINGS

In the drawings, like numerals describe substantially similar components throughout the several views. Like numerals having different letter suffixes represent different instances of substantially similar components.

DETAILED DESCRIPTION

Figure 1:
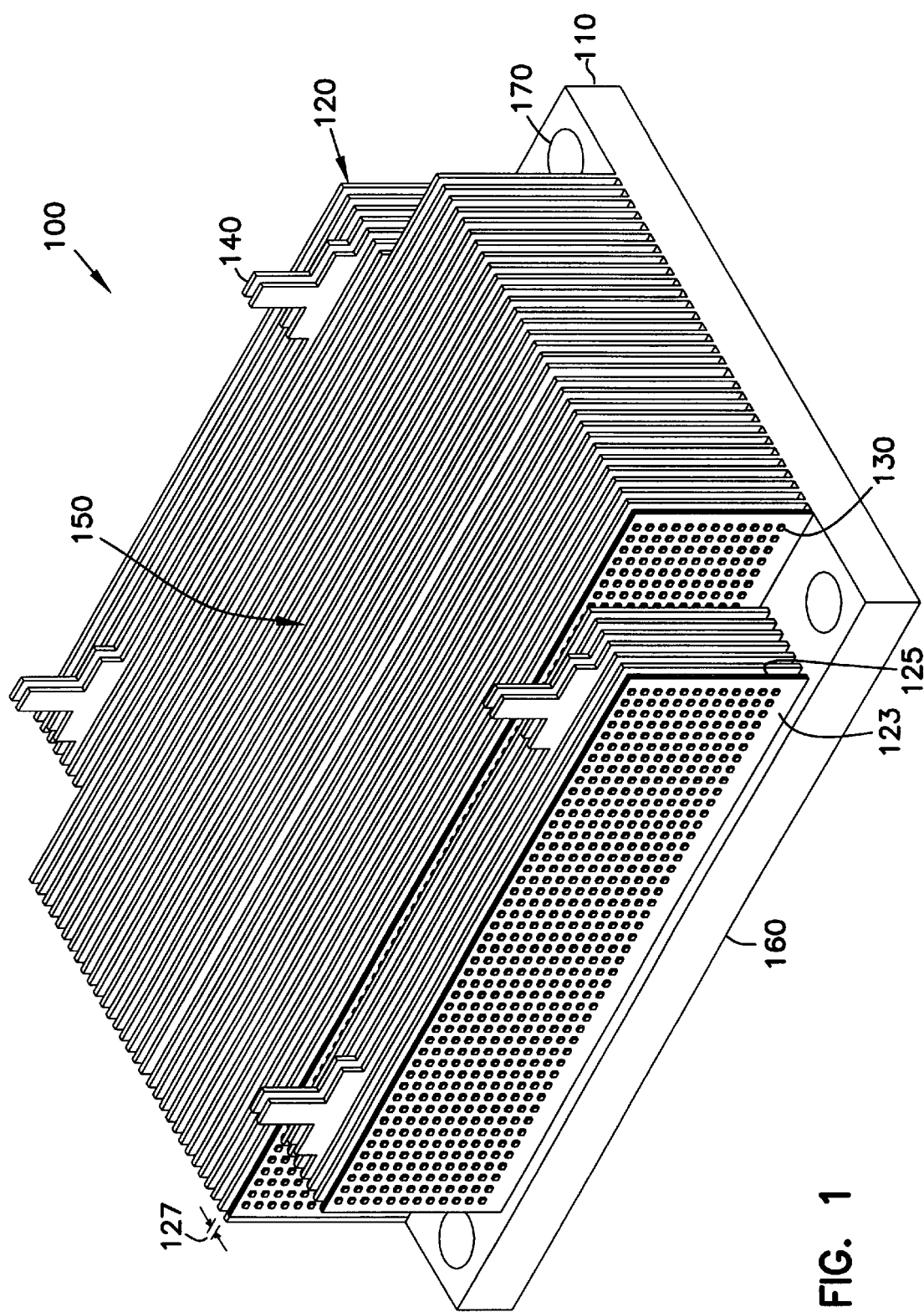
FIG. 1 is a perspective view of one embodiment of the present invention showing generally the heat sink.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views. Like numerals having different letter suffixes represent different instances of substantially similar components.

This document describes, among other things, a heat sink having an enhanced convection surface area. This is accomplished in one embodiment by having a thermally conductive base including a plurality of fin structures extending upwardly from the thermally conductive base. The plurality of fin structures further comprising a plurality of surface area enhancer structures extending outwardly from a first surface of the plurality of fin structures to increase a convection surface area of the heat sink for a given volume.

FIG. 1 is a perspective view illustrating generally, by way of example, but not by way of limitation, one embodiment of a heat sink 100. Thermally conductive base 110 includes a plurality of upwardly extending fin structures 120. The plurality of fin structures 120 have a generally planar first surface 123, and a plurality of surface area enhancer structures 130. In one embodiment the plurality of surface area enhancer structures 130 extend outwardly from the first surface 123 to increase a convection surface area for a given volume of the heat sink 100. In another embodiment a second plurality of surface area enhancer structures (not shown) extend outwardly from a second surface 125 of the plurality of fin structures 120. In one embodiment the second surface 125 is disposed opposite the side of the first surface 123. In one embodiment the first surface area enhancer structures 130 are arranged in an array pattern. In one embodiment the plurality of fin structures 120 are attached laterally to the thermally conductive base 110 having a predetermined gap 127 between the fin structures 120. Also in this embodiment the heat sink has a top surface 150 on the plurality of fin structures 120, and a bottom surface 160 on the thermally conductive base 110 and across from the top surface 150. In this embodiment the plurality of fin structures have a plurality of tabs 140 extending upwardly from the top surface 150 of the plurality of fin structures 120 for locating and fastening a fan on to the top surface 150 of the heat sink 100 for introducing a convection medium to dissipate heat from the heat sink 100. In this embodiment the thermally conductive base 110 has a plurality of holes 170 to locate and fasten a microprocessor on to the bottom surface 160 of the heat sink 100. In one embodiment the thermally conductive base 110 and the plurality of fin structures 120 are made from an oxygen free, high conductivity copper alloy, containing at least 90% copper. In this embodiment the plurality of fin structures 120 are attached to the thermally conductive base 110 by soldering using an eutectic solder having tin and lead in a ratio of 63 to 37 respectively.

Figure 2:
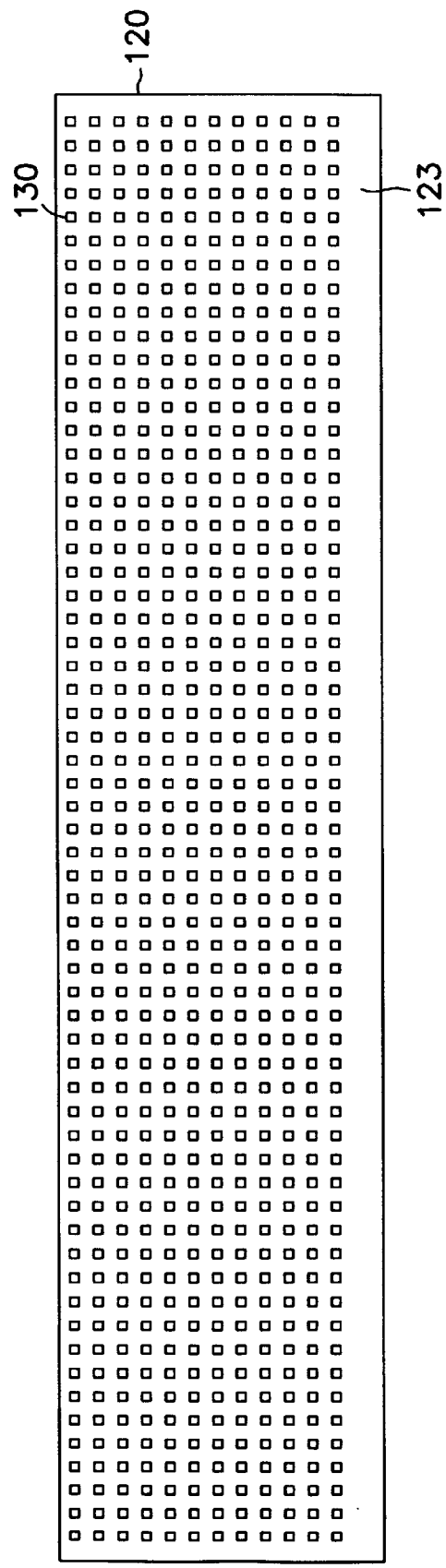
FIG. 2 is a front view of one embodiment of the fin structure.

FIG. 2 is a front view illustrating generally, by way of example, but not by way of limitation, one embodiment of a fin structure 120 having a laterally extending planar first surface 123. The first surface 123 has a first plurality of surface area enhancer structures 130 to increase a convection surface area of the fin structure 120. In one embodiment the surface area enhancers are protrusions extending outwardly from the generally first planar first surface 123 of the fin structure 120. In another embodiment the surface area enhancer structures are bumps extending outwardly from the generally planar first surface 123 of the fin structure 120. In this embodiment the first plurality of surface area enhancer structures 130 are arranged in array pattern.

Figure 3:
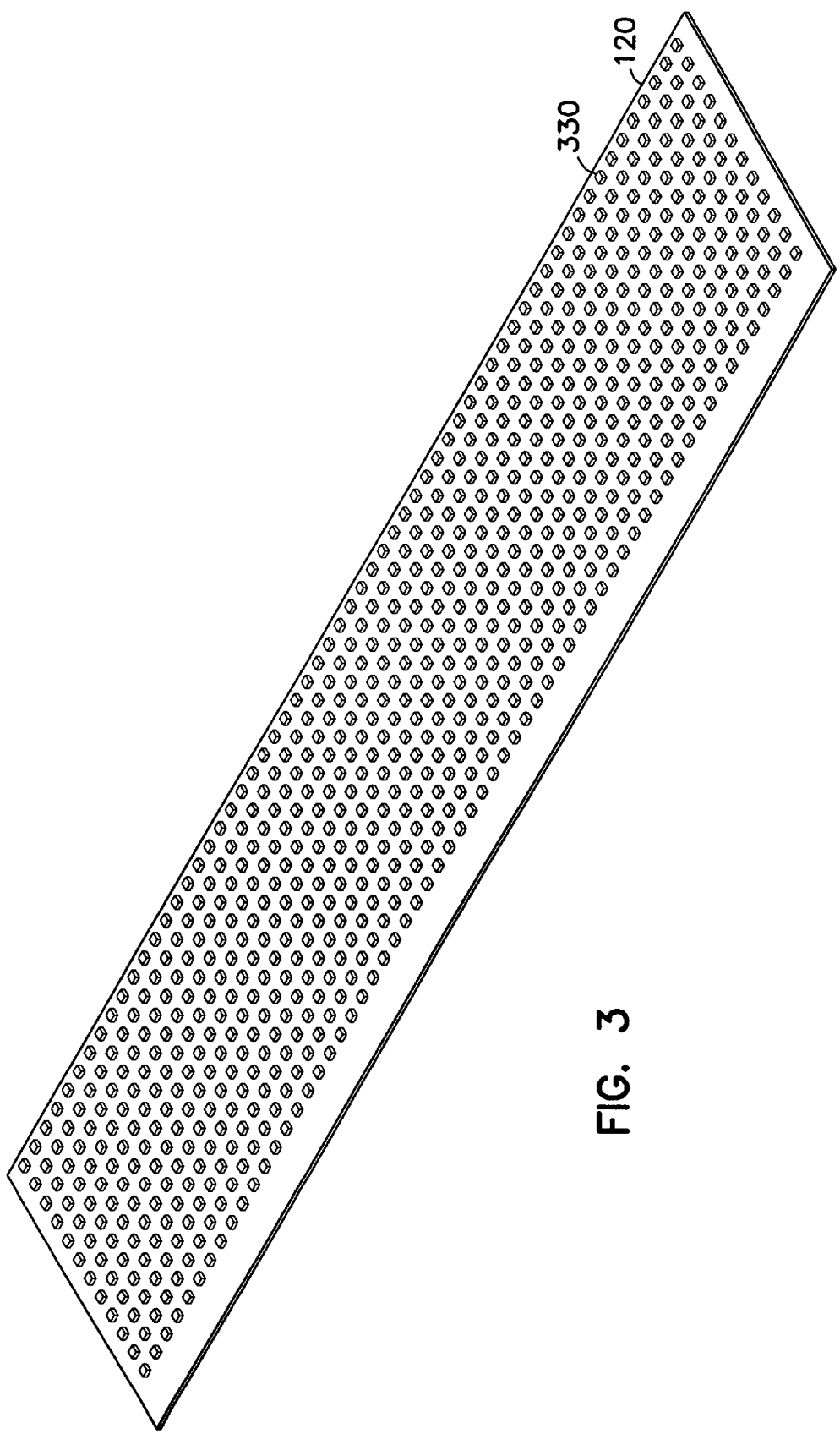
FIG. 3 is a perspective view of one embodiment of the present invention showing generally the fin structure including the surface area enhancer structures.

FIG. 3 is a perspective view of a fin structure 120 showing a first plurality of bumps 330. These bumps 330 can be spherical, cubical, conical, or any other similar shape suitable for enhancing the surface area of a heat sink 100. In this embodiment the first plurality of bumps 330 are shown arranged in an array pattern. In one embodiment the base of bumps 330 is approximately in the range of about 0.015 to 0.035 inches, and the height of the bumps from the base is approximately in the range of about 0.025 to 0.05 inches. For a given volume of the heat sink, these bumps 330 can generally increase the convection surface area and volume of the heat sink by about 10 to 20%, and this can significantly increase the heat dissipation rate by about 10 to 20% over the conventional heat sinks having no bumps 330 in the fin structure 120. In one embodiment the plurality of bumps 330 are chemically etched from the fin structure 120. In another embodiment the plurality of bumps 330 are integrally formed with the fin structure 120. In another embodiment the plurality of bumps 330 are attached to the first surface 123 of the plurality of fin structures 120.

Figure 4:
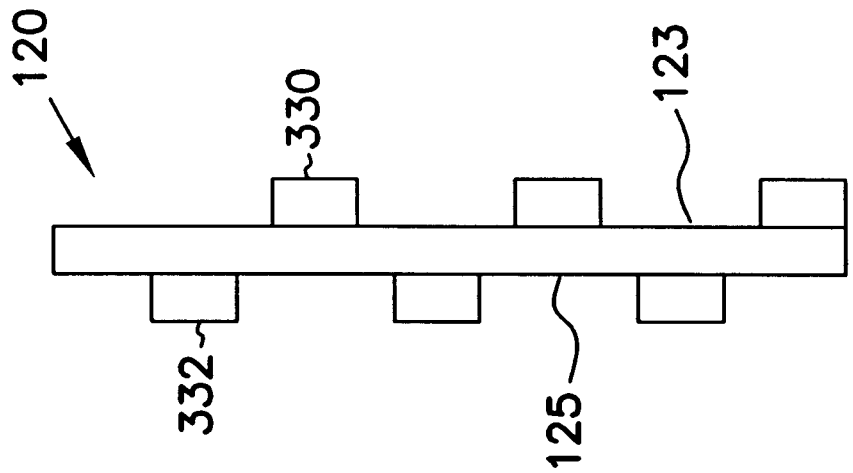
FIG. 4 is a side view of one embodiment of the fin structure showing generally the staggered surface area enhancer structures.

FIG. 4 is a side view illustrating generally, by way of example, but not by way of limitation, one embodiment of a fin structure 120 having staggered first plurality of bumps 330 and second plurality of bumps 332 on first and second surfaces 123 and 125 of the fin structure 120. In this embodiment the first plurality of bumps 330 on the first surface 123 are staggered with respect to the second plurality of bumps 332 on the second surface 125 to eliminate any mechanical contact with the bumps on the first and second surfaces 123 and 125 of adjacent fin structures 120, when a predetermined gap 127 between the fin structures 120 is less than or equal to sum of the height of the first and second plurality of bumps 330 and 332. In this embodiment the first and second plurality of bumps 330 and 332 (not shown for clarity) are arranged in an array pattern. It will be appreciated that the first and second plurality of bumps 330 and 332 can be arranged in different patterns, and the present invention is not limited to an array of bumps. For example, the first and second plurality of bumps 330 and 332 can be arranged in a circular pattern.

Figure 5:
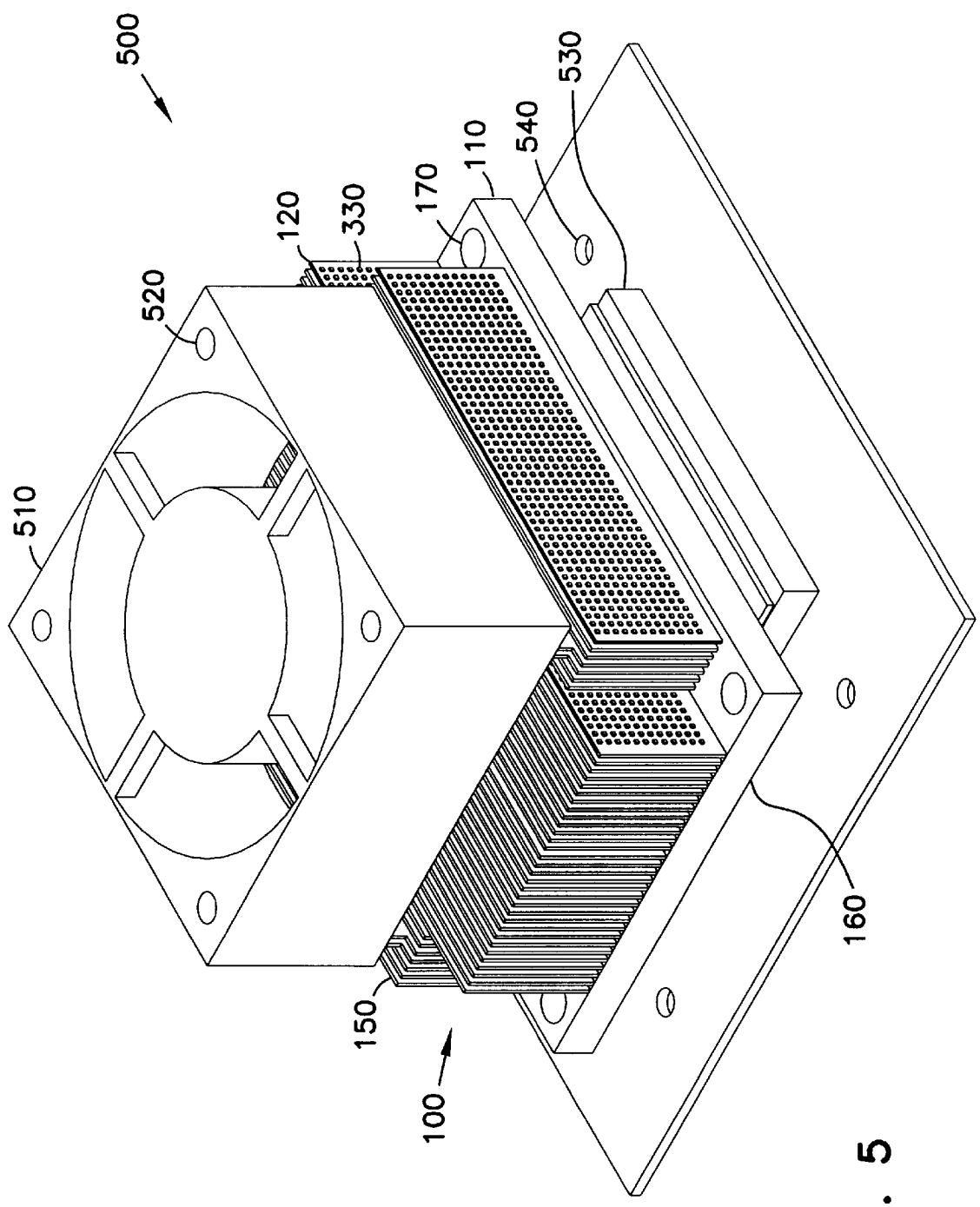
FIG. 5 is a perspective view of another embodiment of the present invention, showing generally the mounting of a fan and a microprocessor to the heat sink.

FIG. 5 is a perspective view illustrating generally, by way of example, but not by way of limitation, one embodiment of a heat sink assembly 500 having a heat sink 100. In this embodiment the heat sink has a thermally conductive base 110, and a plurality of laterally and upwardly extending fin structures 120 extending from the thermally conductive base 110. In this embodiment the heat sink has a top surface 150 on the plurality of fin structures 120 and a bottom surface 160 on the thermally conductive base 110 and across from the top surface 150. In this embodiment the plurality of fin structures has generally planar first and second surfaces 123 and 125 as shown in FIG. 1. In this embodiment the first and second surfaces 123 and 125 have a first and second plurality of bumps such as bumps 330 and 332 (not shown) to increase a convection surface area of the heat sink 100. In this embodiment the heat sink assembly 500 includes a fan 510 attached to the top surface 150 of the heat sink 100. In this embodiment the fan 510 is located and fastened to the top surface 150 of the heat sink 100 by using a plurality of tabs 140 (FIG. 1), on the plurality of fin structures of the heat sink 100, which extend into or through a plurality of holes 520 in the fan 510. Also in this embodiment the heat sink assembly 500 includes a microprocessor 530 attached to a bottom surface 160 of the thermally conductive base 110 of the heat sink 100. In this embodiment the thermally conductive base 110 is attached to the microprocessor 530 by using a fastener which extends into or through a plurality of holes 540 in a printed circuit board and holes 170 in the base 110. In this embodiment the plurality of fin structures 120 includes a predetermined gap 127 between the plurality of fin structures 120. In this embodiment a convection medium is introduced by the fan 510 through the top surface 150 into the predetermined gap 127 of the fin structure 120 and around the first and second plurality of bumps 330 and 332 such that the convection medium has a turbulent flow in the predetermined gap 127 and around the first and second plurality of bumps 330 and 332 to substantially enhance the heat dissipation from the heat sink 100.

Conclusion

The above described heat sink provides, among other things, an enhanced heat dissipation from a microprocessor. The enhanced heat dissipation is accomplished by having a plurality of surface area enhancer structures on a plurality of fin structures attached to a thermally conductive base of the heat sink to substantially increase a convection surface area of the heat sink.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A heat sink, comprising:
    a thermally conductive base; and
    a plurality of fin structures extending upwardly from the thermally conductive base, wherein the plurality of fin structures have a generally planar first surface comprising a first plurality of surface area enhancer structures, wherein the first plurality of surface area enhancer structures have a base approximately in the range of about 0.015 inches to 0.035 inches, and a height from the base approximate in the range of about 0.025 inches to 0.05 inches, wherein the heat sink has a top surface on the fin structures, and a plurality of tabs extend upwardly from the top surface of the fin structures.

2. The heat sink of claim 1, wherein the plurality of fin structures further have a generally planar second surface opposite the first surface, the second surface comprising a second plurality of surface area enhancer structures wherein the second plurality of surface area enhancer structures have a base approximately in the range of about 0.015 inches to 0.035 inches, and a height from the base approximately in the range of about 0.025 inches to 0.05 inches.

3. The heat sink of claim 2, wherein the plurality of fin structures have a predetermined gap between the plurality of fin structures.

4. The heat sink of claim 1, wherein the first plurality of surface area enhancer structures are arranged in an array pattern.

5. The heat sink of claim 2, wherein the plurality of surface area enhancer structures are protrusions extending outwardly from the first and second surfaces respectively.

6. The heat sink of claim 2, wherein the first and the second plurality of surface area enhancer structures are bumps extending outwardly from the first and second surfaces.

7. The heat sink of claim 6, wherein the bumps have a shape selected from the group consisting of cubical, spherical, and conical.

8. The heat sink of claim 6, wherein the bumps are integrally formed with the fin structure.

9. The heat sink of claim 6, wherein the bumps are chemically etched from the fin structure.

10. The heat sink of claim 6, wherein the bumps are attached to the fin structure.

11. The heat sink of claim 6, wherein the bumps on the first surface are staggered with respect to the bumps on the second surface to avoid mechanical interference with the bumps when the predetermined gap between the fin structures is less than or equal to a sum of the height of the bumps.

12. The heat sink of claim 1, further comprising a fan attached to the plurality of fin structures of the heat sink to introduce a convection medium between the plurality of fin structures.

13. The heat sink of claim 1, further comprising a circuit package thermally coupled to a bottom surface of the thermally conductive base.

14. The heat sink of claim 13, further comprising a thermally conductive interface material between the circuit package and the bottom surface of the heat sink.

15. The heat sink of claim 1, wherein the thermally conductive base and the plurality of fin structures are made from an oxygen free, high conductivity copper alloy, containing at least 90% copper.

16. The heat sink of claim 1, wherein the plurality of fin structures are soldered to the thermally conductive base.

17. A heat sink assembly, comprising:

a heat sink having a thermally conductive base, and a plurality of fin structures laterally and upwardly extending from the thermally conductive base, wherein the plurality of fin structures have generally planar first and second surfaces, wherein the first and second surfaces comprise a plurality of surface area enhancer structures extending outwardly from the first and second surfaces, and wherein the plurality of fin structures are separated by a predetermined gap, wherein the surface area enhancer structures have a base approximately in the range of about 0.015 inches to 0.035 inches, and a height from the base approximately in the range of about 0.025 inches to 0.05 inches, wherein the heat sink has a top surface on the fin structures, and a plurality of tabs extend upwardly from the top surface of the fin structures;

a fan attached to a top surface of the heat sink to introduce a convection medium between the plurality of fin structures; and a circuit package, thermally coupled to a bottom surface of the thermally conductive base.

18. The heat sink of claim 17, wherein the plurality of surface area enhancer structures are protrusions extending outwardly from the first and second surfaces.

19. The heat sink of claim 17, wherein the plurality of surface area enhancer structures are bumps, wherein the bumps extend outwardly from the first and second surfaces.

20. The heat sink of claim 19, wherein the bumps have a shape selected from the group consisting of cubical, spherical, and conical.

21. The heat sink of claim 19, wherein the bumps are chemically etched from the plurality of fin structures.

22. A method of increasing a heat sink convection surface area, the method comprising: providing a first plurality of surface area enhancer structures on a generally planar first surface of a plurality of fin structures of the heat sink by chemically etching the first surface of the plurality of fin structures, wherein the first plurality of surface area enhancer structures have a base approximately in the range of about 0.015 inches to 0.035 inches, and a height from the base approximately in the range of about 0.025 inches to 0.05 inches.

23. The method of claim 22, further comprising providing a second plurality of surface area enhancer structures on a generally planar second surface of the plurality of fin structures of the heat sink by chemically etching the second surface of the plurality of fin structures such that the second plurality of surface area enhancer structures have a base approximately in the range of about 0.015 inches to 0.035 inches, and a height from the base approximately in the range of about 0.025 inches to 0.05 inches.

24. The method of claim 22, wherein the providing of the first plurality of surface area enhancer structures comprises integrally forming the first plurality of surface area enhancer structures from the fin structures of the heat sink.

25. The method of claim 22, wherein the providing of the first plurality of surface area enhancer structures comprises attaching the first plurality of surface area enhancer structures to the first surface of the plurality of fin structures of the heat sink.

26. A method of dissipating heat from a microprocessor comprising:

providing a plurality of surface area enhancer structures on a generally planar first and second surfaces of a plurality of fin structures of the heat sink by chemically etching the first and second surfaces to increase a convection surface area of a heat sink, wherein the surface area enhancer structures have a base approximately in the range of about 0.015 inches to 0.035 inches, and a height from the base approximately in the range of about 0.025 inches to 0.05 inches, wherein the plurality of fin structures have a predetermined gap between the fin structures;

attaching a fan to the plurality of fin structures such that a convection medium can be introduced through the predetermined gap and around the plurality of surface area enhancer structures; and attaching the heat sink to the microprocessor to dissipate heat from the microprocessor.

27. The method of claim 26, wherein providing a plurality of surface area enhancer structures comprises, integrally forming the plurality of fin surface area enhancer structures with the fin structures.

28. The method of claim 26, wherein the attaching the fan includes fastening the fan to the plurality of fin structures.

* * * * *